(12) United States Patent
Abadeer et al.

(10) Patent No.: US 8,021,950 B1
(45) Date of Patent: Sep. 20, 2011

(54) SEMICONDUCTOR WAFER PROCESSING METHOD THAT ALLOWS DEVICE REGIONS TO BE SELECTIVELY ANNEALED FOLLOWING BACK END OF THE LINE (BEOL) METAL WIRING LAYER FORMATION

(75) Inventors: Wagdi W. Abadeer, Essex Junction, VT (US); Lilian Kamal, legal representative, Saratoga, CA (US); John J. Ellis-Monaghan, Grand Isle, VT (US); Jeffrey P. Gambino, Westford, VT (US); Tom C. Lee, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/911,940

(22) Filed: Oct. 26, 2010

(51) Int. Cl.
*H01L 21/336* (2006.01)

(52) U.S. Cl. .......... 438/308; 438/285; 438/46; 438/602; 438/530; 438/655; 257/E21.241; 257/E21.409; 257/E29.255

(58) Field of Classification Search .................. 438/308, 438/655, 285, 46, 602, 530; 257/288, E21.241, 257/E21.409, E29.255
See application file for complete search history.

(56) References Cited

U.S. PATENT DOCUMENTS

| | | | |
|---|---|---|---|
| 4,151,007 A | 4/1979 | Levinstein et al. | |
| 4,456,490 A | 6/1984 | Dutta et al. | |
| 5,897,381 A | 4/1999 | Aronowitz et al. | |
| 5,956,603 A | 9/1999 | Talwar et al. | |
| 6,380,044 B1 | 4/2002 | Talwar et al. | |
| 6,645,838 B1 | 11/2003 | Talwar et al. | |
| 6,797,641 B2 | 9/2004 | Holmes et al. | |
| 6,924,219 B1 | 8/2005 | Chu et al. | |
| 7,071,042 B1 | 7/2006 | Maa et al. | |
| 7,129,564 B2 | 10/2006 | Beintner et al. | |
| 7,629,661 B2 | 12/2009 | Rafferty et al. | |
| 2003/0170971 A1* | 9/2003 | Tomoda et al. | 438/602 |
| 2004/0075122 A1* | 4/2004 | Lin et al. | 257/288 |
| 2005/0029601 A1 | 2/2005 | Chen et al. | |
| 2006/0240667 A1* | 10/2006 | Matsuda et al. | 438/655 |

(Continued)

OTHER PUBLICATIONS

Ranade et al., "A Novel Elevated Source/Drain PMOSFET Formed by Ge-B/Si Intermixing", IEEE, vol. 23, No. 4, Apr. 2002, 3 pages.

(Continued)

*Primary Examiner* — William M Brewster
*Assistant Examiner* — Wilner Jean Baptiste
(74) *Attorney, Agent, or Firm* — Gibb I.P. Law Firm, LLC; Michael J. LeStrange, Esq.

(57) ABSTRACT

Disclosed are embodiments of a semiconductor wafer processing method that allow device regions to be selectively annealed following back end of the line (BEOL) metal wiring formation without degrading wiring layer reliability. In the embodiments, a semiconductor device is formed adjacent to the top surface of a wafer such that it incorporates a selectively placed infrared absorbing layer (IAL). Then, following BEOL metal wiring formation, the bottom surface of the wafer is exposed to an infrared light having a wavelength that is transparent to the wafer. The infrared light is absorbed by and, thereby heats up the IAL to a first predetermined temperature (e.g., a dopant activation temperature, a temperature required for a state change, etc.). The resulting heat is transferred from the IAL to an adjacent region of the semiconductor device without raising the temperature of the metal wiring above a second predetermined temperature (e.g., a temperature that could degrade the metal wiring) that is lower than the first predetermined temperature.

20 Claims, 11 Drawing Sheets

U.S. PATENT DOCUMENTS

| | | |
|---|---|---|
| 2008/0248616 A1 | 10/2008 | Shang et al. |
| 2008/0280428 A1* | 11/2008 | Ito .............................. 438/530 |
| 2009/0121157 A1 | 5/2009 | Moffatt et al. |
| 2009/0166737 A1* | 7/2009 | Kim .............................. 257/344 |
| 2009/0256173 A1 | 10/2009 | Chen et al. |
| 2009/0289301 A1 | 11/2009 | Shieh et al. |
| 2010/0087061 A1 | 4/2010 | Mai et al. |
| 2010/0093182 A1 | 4/2010 | Jitsuno et al. |
| 2010/0099268 A1 | 4/2010 | Timans |
| 2010/0200935 A1 | 8/2010 | Hokazono |
| 2010/0301350 A1* | 12/2010 | Tamura et al. .................. 257/77 |

OTHER PUBLICATIONS

Possin et al., "The Effects of Selectively Absorbing Dielectric Layers and Beam Shaping on Recrystallization and FET Characteristics in Laser Recrystallized Silicon O", MRS, 1995-2010.

* cited by examiner

SEMICONDUCTOR WAFER PROCESSING METHOD THAT ALLOWS DEVICE REGIONS TO BE SELECTIVELY ANNEALED FOLLOWING BACK END OF THE LINE (BEOL) METAL WIRING LAYER FORMATION

BACKGROUND

1. Field of the Invention

The present invention relates to semiconductor wafer processing and, more specifically, to embodiments of a semiconductor wafer processing method that allow device regions to be selectively annealed following back end of the line (BEOL) metal wiring layer formation.

2. Description of the Related Art

Thermal anneals are often performed during middle of the line (MOL) semiconductor wafer processing in order to repair damage caused by the implantation of dopants (e.g., source/drain dopants), to diffuse dopants, to activate those dopants, to change the state of semiconductor material (e.g., to crystallize or recrystallize semiconductor material), etc. Thermal anneals can also be used to passivate an interface between different materials (e.g., an interface between a semiconductor layer and a dielectric layer) when performed in the presence of a gas, such as hydrogen. It would be advantageous to be able to perform a thermal anneal following back end of the line (BEOL) metal wiring layer formation; however, the temperature and processing time typically required for such thermal anneals can degrade the reliability of the metal wiring and, thereby impact performance.

SUMMARY

In view of the foregoing disclosed herein are embodiments of a semiconductor wafer processing method that allow device regions to be selectively annealed following back end of the line (BEOL) metal wiring layer formation without degrading wiring layer reliability. Generally, the method embodiments comprise providing a wafer that has a bottom surface and a top surface opposite the bottom surface. A semiconductor device can be formed adjacent to the top surface. This semiconductor device can specifically be formed such that it incorporates one or more selectively placed infrared absorbing layers. That is, the semiconductor device can be formed with an infrared absorbing layer (e.g., a germanium layer) selectively placed adjacent to a specific region of the semiconductor device requiring a thermal anneal. Then, BEOL processing can be performed. That is, at least one dielectric layer can be formed on the semiconductor device and at least one layer of metal wiring can be formed on the dielectric layer. Following BEOL metal wiring layer formation, the infrared absorbing layer can be selectively heated to a first predetermined temperature (e.g., a dopant activation temperature, a temperature required for a state change, etc.) by exposing the bottom surface of the wafer to an infrared light having a wavelength that is transparent to the wafer, but absorbed by the infrared absorbing layer. This selective heating process can be performed so that heat from the infrared absorbing layer is transferred to the adjacent region of the semiconductor device without raising the temperature of the metal wiring above a second predetermined temperature (e.g., a temperature that could degrade the metal wiring, such as the melting temperature of the metal wiring material) that is lower than the first predetermined temperature.

One exemplary embodiment of the method can comprise providing a wafer that has a bottom surface and a top surface opposite the bottom surface. A semiconductor device and, particularly, a field effect transistor can be formed adjacent to the top surface. The process of forming the semiconductor device can comprising forming a gate structure on a channel region such that the gate structure comprises a gate dielectric layer adjacent to the channel region, a gate conductor layer adjacent to the gate dielectric layer and an infrared absorbing layer positioned either between the gate dielectric layer and the gate conductor layer or above the gate conductor layer. The infrared absorbing layer can comprise, for example, a doped germanium layer. Then, BEOL processing can be performed. That is, at least one dielectric layer can be formed on the semiconductor device and at least one layer of metal wiring can be formed on the dielectric layer. Following BEOL metal wiring layer formation, the infrared absorbing layer within the gate structure can be selectively heated to a first predetermined temperature (e.g., a dopant activation temperature, a temperature required for a state change, etc.) by exposing the bottom surface of the wafer to an infrared light having a wavelength that is transparent to the wafer, but absorbed by the infrared absorbing layer. This selective heating process can be performed so that heat from the infrared absorbing layer is transferred to the channel region below the gate structure and, optionally, to one or more additional regions of the device adjacent to the channel region (e.g., source/drain regions, halos, and/or source/drain extensions) without raising the temperature of the metal wiring above a second predetermined temperature (e.g., a temperature that could degrade the metal wiring, such as the melting temperature of the metal wiring material) that is lower than the first predetermined temperature.

Another exemplary embodiment of the method can comprise providing a wafer that has a bottom surface and a top surface opposite the bottom surface. A semiconductor device and, particularly, a field effect transistor can be formed adjacent to the top surface. The semiconductor device can be formed such that it comprises a channel region and further such that the channel region comprises an infrared absorbing layer. This infrared absorbing layer can comprise, for example, a strained germanium layer. Then, BEOL processing can be performed. That is, at least one dielectric layer can be formed on the semiconductor device and at least one layer of infrared reflective metal wiring can be formed on the dielectric layer. Following BEOL metal wiring layer formation, the infrared absorbing layer within the channel region can be selectively heated to a first predetermined temperature (e.g., a dopant activation temperature, a temperature required for a state change, etc.) by exposing the bottom surface of the wafer to an infrared light having a wavelength that is transparent to the wafer, but absorbed by the infrared absorbing layer. This selective heating process can be performed so that heat from the infrared absorbing layer is transferred to adjacent portions of the channel region and, optionally, to one or more additional regions of the semiconductor device adjacent to the channel region (e.g., source/drain regions, halos, and/or source/drain extensions) without raising the temperature of the metal wiring above a second predetermined temperature (e.g., a temperature that could degrade the metal wiring, such as the melting temperature of the metal wiring material) that is lower than the first predetermined temperature.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, thermal anneals are often performed during middle of the line (MOL) semiconductor wafer processing in order to repair damage caused by the implantation of dopants (e.g., source/drain dopants), to diffuse or drive dopants, to activate those dopants, to change the state of semiconductor material (e.g., to crystallize or recrystallize semiconductor material), etc. Thermal anneals can also be used to passivate an interface between different materials (e.g., an interface between a semiconductor layer and a dielectric layer), when performed in the presence of a gas, such as hydrogen. It would be advantageous to be able to perform a thermal anneal following back end of the line (BEOL) metal wiring layer formation; however, the temperature and processing time typically required for such thermal anneals can degrade the reliability of the metal wiring and, thereby impact performance.

In view of the foregoing disclosed herein are embodiments of a semiconductor wafer processing method that allow device regions to be selectively annealed following back end of the line (BEOL) metal wiring layer formation without degrading wiring layer reliability. In the embodiments, a semiconductor device is formed adjacent to the top surface of a wafer such that it incorporates a selectively placed infrared absorbing layer. Then, following BEOL metal wiring layer formation, the bottom surface of the wafer is exposed to an infrared light having a wavelength that is transparent to the wafer. The infrared light is absorbed by and, thereby heats up the infrared absorbing layer to a first predetermined temperature (e.g., a dopant activation temperature, a temperature required for a state change, etc.). The resulting heat is transferred from the infrared absorbing layer to an adjacent region of the semiconductor device without raising the temperature of the metal wiring above a second predetermined temperature (e.g., a temperature that could degrade the metal wiring, such as the melting temperature of the wiring material) that is lower than the first predetermined temperature. Such selectively placed infrared absorbing layers can be used to selectively anneal various different device regions of various different types of devices following back end of the line (BEOL) metal wiring layer formation without degrading wiring layer reliability.

Figure 1:
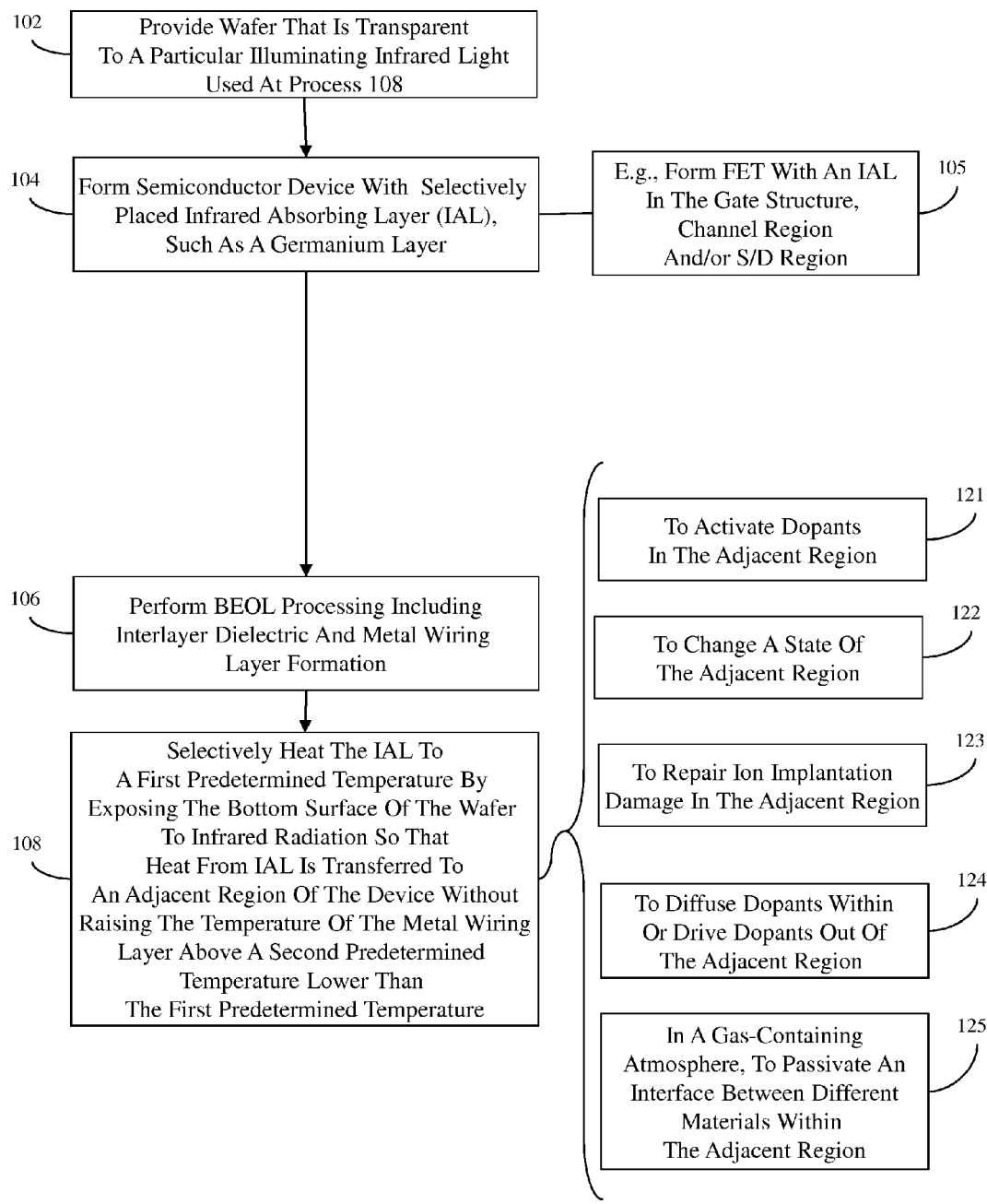
FIG. 1 is a flow diagram illustrating generally the embodiments of the method, according to the present invention.

Referring to the flow diagram of FIG. 1, generally, the embodiments of the method of the present invention comprise providing a semiconductor wafer having a bottom surface and a top surface opposite the bottom surface (102). The provided wafer can, for example, comprise a bulk silicon wafer. Alternatively, the wafer can, for example, comprise a semiconductor-on-insulator (SOI) wafer comprising a silicon or glass substrate, a silicon oxide layer on the substrate and a single crystalline silicon layer on the silicon oxide layer. However, in any case, the provided wafer must be essentially transparent to the particular illuminating infrared light that will be used at process 108, discussed below.

A semiconductor device (e.g., a planar field effect transistor, non-planar field effect transistor, such as fin-type, dual-gate or trigate, field effect transistor, a bipolar transistor, a heterojunction bipolar transistor, a diode, a capacitor, a resistor, etc.) can be formed adjacent to (e.g., within and/or on) the top surface of the wafer (104). This semiconductor device can specifically be formed such that it incorporates one or more selectively placed infrared absorbing layers.

For example, in the case of a field effect transistor an infrared absorbing layer can be incorporated into the gate structure, the channel region and/or the source/drain regions such that it is adjacent to a specific region of the semiconductor device requiring a thermal anneal (105). This infrared absorbing layer can comprise, for example, a pure germanium layer having a state that is single crystalline, polycrystalline or amorphous, depending upon where in the semiconductor device it is incorporated. Alternatively, the infrared absorbing layer can comprise a germanium alloy with a relatively high concentration of germanium. For example, the infrared absorbing layer can comprise a silicon germanium alloy preferably with a germanium concentration of greater than 90% for optimal infrared absorption. While a lesser concentration of germanium (e.g., a concentration of germanium as low as 20%) can be used, lowering the concentration of germanium limits the frequency of the infrared light that can be absorbed by the layer at process 108, discussed below. As with the state of the pure germanium layer, the state of the germanium alloy layer can also be single crystalline, polycrystalline or amorphous, depending upon where in the semiconductor device it is incorporated.

It should be understood that the use of an infrared absorbing layer comprising pure germanium or a germanium alloy is preferred because many known semiconductor device structures already incorporate such layers. For example, U.S. Pat. No. 6,797,641 of Holmes et al., issued on Sep. 28, 2004, assigned to International Business Machines Corporation and incorporated herein by reference, discloses a field effect transistor having a gate structure including a layer of germanium. U.S. Patent Application Publication No. 20080248616 of Shang et al., published on Oct. 9, 2008, assigned to International Business Machines Corporation and incorporated herein by reference, discloses a field effect transistor having a channel region including a layer of germanium. U.S. Patent Application Publication No. 20050029601 of Chen et al., published on Feb. 10, 2005, assigned to International Business Machines Corporation and incorporated herein by reference, discloses a field effect transistor having a source/drain region with an embedded silicon germanium alloy having a germanium concentration of up to 99%. However, those skilled in the art will recognize that any other suitable infrared absorbing layer could be used (e.g. Indium Antimonide (InSb), Indium Arsenide (InAs), Platinum Silicide (PtSi), Mercury Cadmium Telluride (HgCdTe), Lithium Tantalate (LiTaO$_3$) etc.).

After the semiconductor device is formed with the infrared absorbing layer, conventional BEOL processing can be performed to interconnect the semiconductor device and other devices on the wafer through contact and metal level formation (106). That is, one or more dielectric layers can be formed on the semiconductor device. The dielectric layers can comprise one or more conventional interlayer dielectric materials (e.g., a silicon nitride, a silicon oxide, borophosphosilicate glass (BPSG), etc.). Contacts can be formed through the dielectric layer(s), as necessary, and one or more levels of metal wiring can be formed above the dielectric layer(s) so as to interconnect the devices.

Following BEOL metal wiring layer formation at process 106, the infrared absorbing layer can be selectively heated to a predetermined temperature (e.g., a temperature between approximately 200° C. and 800° C. or higher) for a relatively short period of time (e.g., less than a second for higher temperatures and longer for lower temperatures) by exposing the bottom surface of the wafer to infrared radiation (i.e., to infrared light) (108). This selective heating process 108 can be accomplished using either a continuous or pulsed infrared laser capable of directing a beam of infrared light to a localized region of the semiconductor device through the back surface of the wafer. It should be noted that the specific infrared wavelength used in this selective heating process 108 will be preselected based on the infrared absorbing, transmitting and reflecting properties of the infrared absorbing layer and the materials adjacent to the infrared absorbing layer. Those skilled in the art will recognize that temperature may also impact these properties.

For example, lights with wavelengths between about 0.7 µm and about 300 µm are within the infrared range. A bulk silicon wafer is opaque to lights with wavelengths between about 0.4 µm and about 1.1 µm; transparent to lights with wavelengths between about 1.2 µm and 8 µm, absorbs lights with wavelengths between about 8 µm and about 10 µm, transparent to lights with wavelengths between about 10 µm and 12 µm and absorbs light with wavelengths between about 15 µm and about 21 µm. A pure germanium layer is transparent to lights with wavelengths between about 2 µm and about 10 µm at room temperature, but absorbs lights with such wavelengths at temperatures greater than 100° C. Thus, if a bulk silicon wafer is provided at process 102 and if pure germanium infrared absorbing layer is incorporated into the device formed at process 104, then an optimal illuminating infrared light used at process 108 can have a wavelength between about 1.2 µm and about 2 µm. These numbers will vary if either the wafer material or infrared absorbing material changes. In other words, the optimal wavelength will depend upon the relative transmittance of infrared absorbing layer and the material adjacent to the infrared absorbing layer.

The selective heating process 108 can be performed so that heat from the infrared absorbing layer is transferred to an adjacent region of the semiconductor device. However, the intensity and duration of this heating process 108 should be limited so as to avoid overheating the nearest BEOL metal structures (e.g., so that the nearest BEOL metal structures are not heated above a predetermined temperature, such as 400 C.°). Specifically, the selective heating process 108 should be performed so that the rest of the wafer (i.e., all regions of the wafer other than the infrared absorbing layer and the adjacent region requiring heating) remain at a lower temperature (e.g., less than approximately 400° C.). It should be noted if a higher heating temperature (e.g., a temperature over 800° C. and as high as 1100° C. for high dopant activation) is desired, the selective heating process 108 can be performed so as to achieve the higher heating temperature without overheating the nearest BEOL metal structures, e.g., by using a high speed laser capable of performing a sub-second heating process.

The transferred heat at process 108 can, for example, activate dopants in that adjacent region (121), change a state of that adjacent region (e.g., to crystallize or re-crystallize an amorphous region) (122), repair damage caused by ion implantation into that adjacent region (123), diffuse dopants within or drive dopants out of that adjacent region (124), etc. This selective heating process 108 can also be performed in a gas-containing atmosphere in order to passivate an interface between different materials within the adjacent region of the semiconductor device (125). For example, this selective heating process 108 can be performed in a hydrogen-containing atmosphere in order to passivate the interface between a semiconductor layer (e.g., a silicon layer) and a dielectric layer (e.g., a silicon oxide layer or a silicon nitride layer) by causing hydrogen atoms to terminate all electrically active dangling bonds at the interface.

Figure 2:
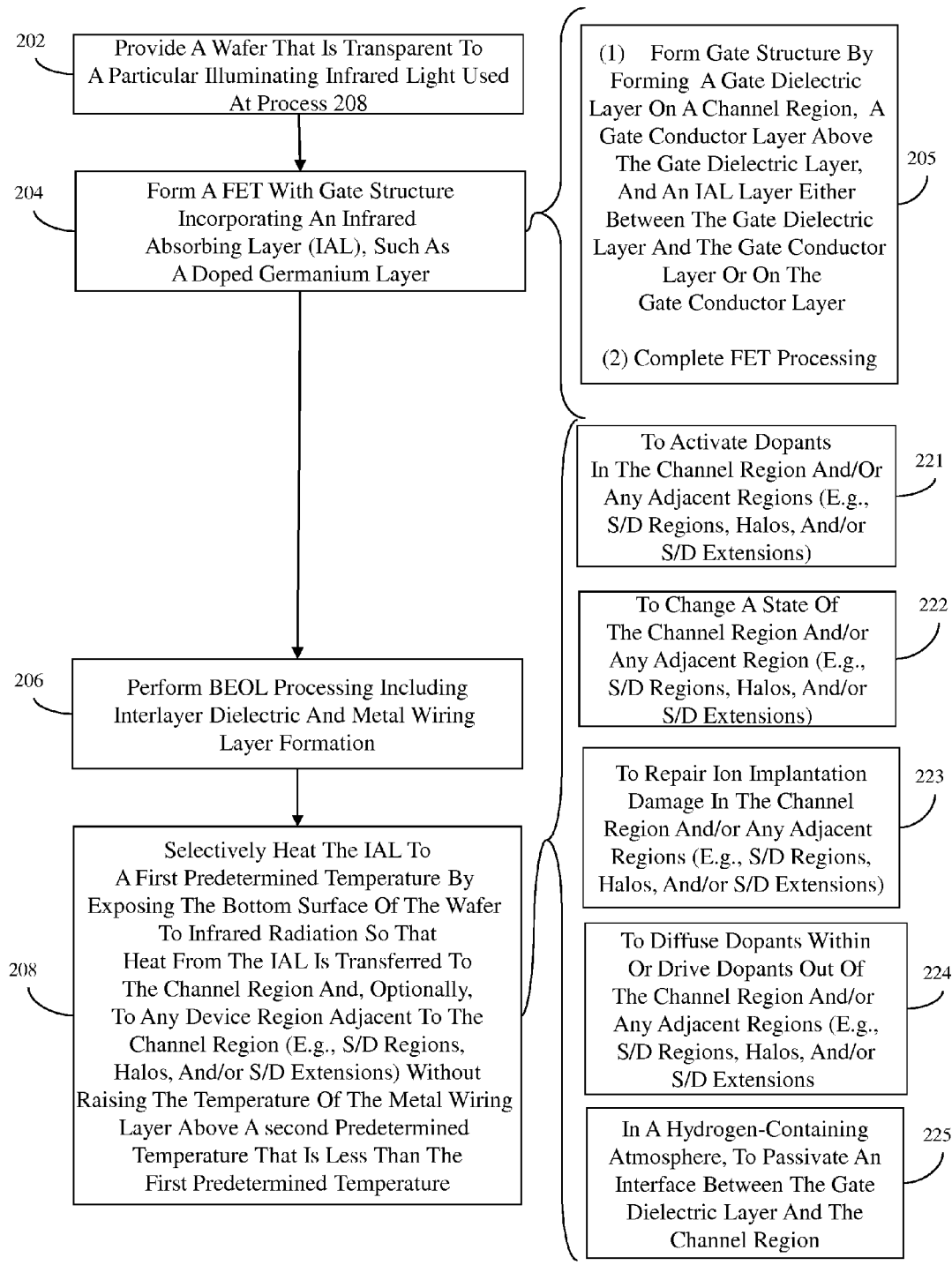
FIG. 2 is a flow diagram illustrating an exemplary embodiment of the method, according to the present invention.
Figure 3:
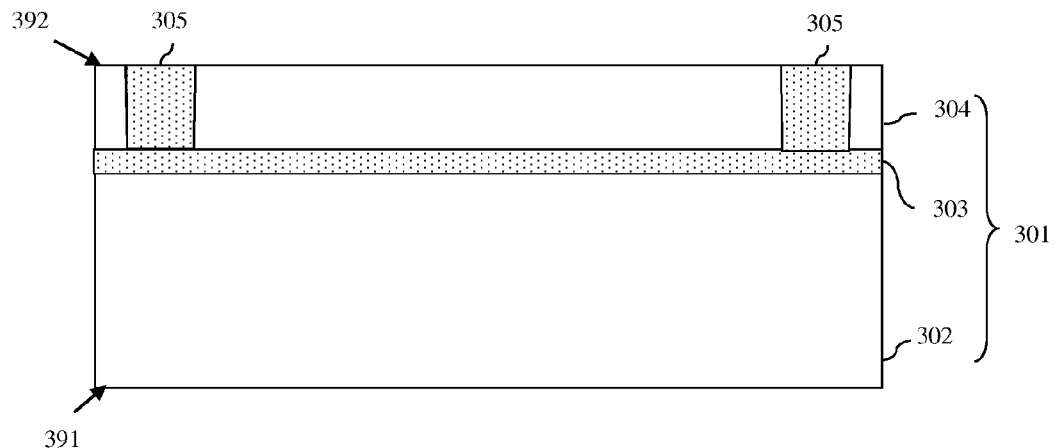
FIG. 3 is a partially completed semiconductor structure formed according to method embodiment of FIG. 2.

Referring to the flow diagram of FIG. 2, one exemplary embodiment of the method can comprise providing a semiconductor wafer 301 having a bottom surface 391 and a top surface 392 opposite the bottom surface 391 (202) (see FIG. 3). The provided wafer 301 can comprise, for example, a bulk silicon wafer. Alternatively, the wafer 301 can, for example, comprise a semiconductor-on-insulator (SOI) wafer, as shown in FIG. 3, comprising a silicon or glass substrate 302, a silicon oxide layer 303 on the substrate 301 and a single crystalline silicon layer 304 on the silicon oxide layer 303. However, in any case, the provided wafer 301 must be essentially transparent to the particular illuminating infrared light that will be used at process 208, discussed below.

A semiconductor device and, particularly, a field effect transistor (FET) having a gate structure incorporating an infrared absorbing layer can be formed adjacent to (e.g., within and/or on) the top surface 392 of the wafer 301 (204). Specifically, isolation structures 305 (e.g., shallow trench isolation (STI) structures filled, for example, with silicon oxide) can be formed using conventional STI processing techniques to define the active region of the field effect transistor (see FIG. 3).

Figure 4:
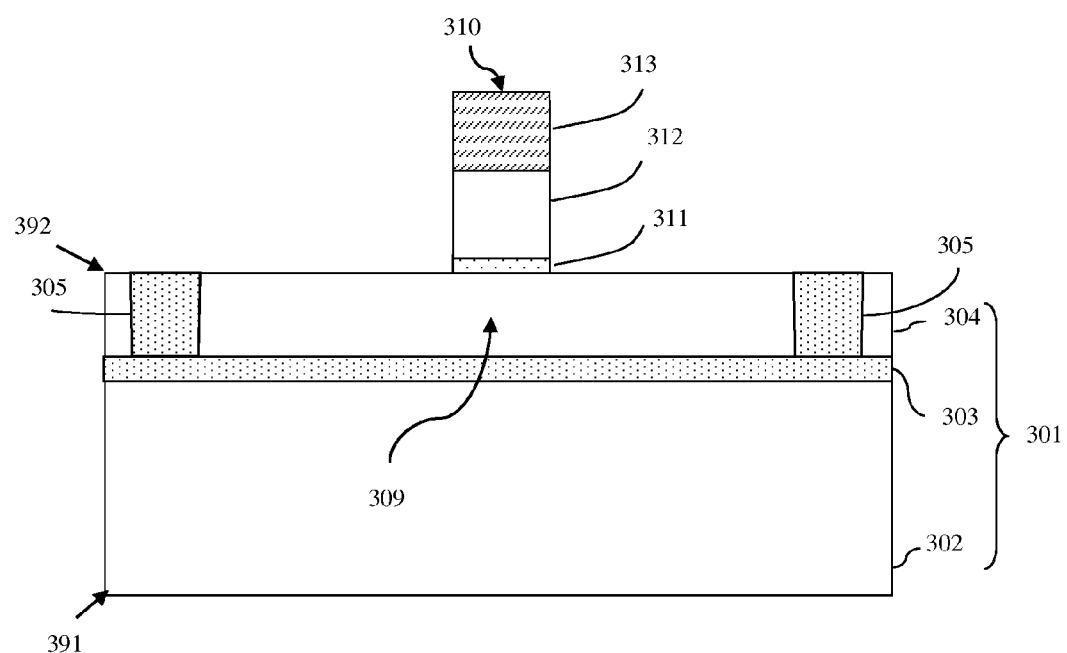
FIG. 4 is a partially completed semiconductor structure formed according to method embodiment of FIG. 2.

Next, a gate structure 310 can be formed on a designated channel region 309 within the active area defined by the STIs 305 (205) (see FIG. 4). The gate structure 310 can be formed using conventional deposition and lithographic processing techniques such that it comprises a gate dielectric layer 311 adjacent to the channel region 309, a gate conductor layer 312 adjacent to the gate dielectric layer 311 and an infrared absorbing layer 313 positioned above the gate conductor layer 312 (e.g., as shown in FIG. 4) or between the gate dielectric layer 311 and the gate conductor layer 312 (e.g., as shown in U.S. Pat. No. 6,797,641 of Holmes et al. incorporated by reference above) or can completely replace the gate conductor layer (i.e., can also function as the gate conductor layer) (not shown).

In this gate structure 310, the gate dielectric layer 311 can comprise, for example, a silicon oxide layer or other suitable gate dielectric material that is infrared transparent. The gate conductor layer 312 can comprise a polysilicon layer, which is also infrared transparent, particularly if the infrared absorbing layer 313 is above the gate conductor layer 312. This infrared absorbing layer 313 can have a thickness ranging between 0.003 μm and 10 μm and, preferably, ranging between 0.01 μm and 05 μm. The infrared absorbing layer 313 can comprise, for example, a pure polycrystalline germanium layer. Alternatively, the infrared absorbing layer 313 can comprise a polycrystalline germanium alloy layer with a relatively high concentration of germanium. For example, the infrared absorbing layer can comprise a polycrystalline germanium alloy preferably with a germanium concentration of greater than 90% for optimal infrared absorption. A polycrystalline germanium alloy infrared absorbing layer with a lesser concentration of germanium (e.g., a concentration as low as 20%) could also be used; however, lowering the concentration limits the frequency of the infrared light that can be used at process 208 discussed below. As discussed above, the use of an infrared absorbing layer 313 comprising pure germanium or a germanium alloy is preferred because many known semiconductor device structures already incorporate such layers; however, those skilled in the art will recognize that any other suitable infrared absorbing layer could be used (e.g. Indium Antimonide (InSb), Indium Arsenide (InAs), Platinum Silicide (PtSi), Mercury Cadmium Telluride (HgCdTe), Lithium Tantalate (LiTaO$_3$) etc.).

Figure 5:
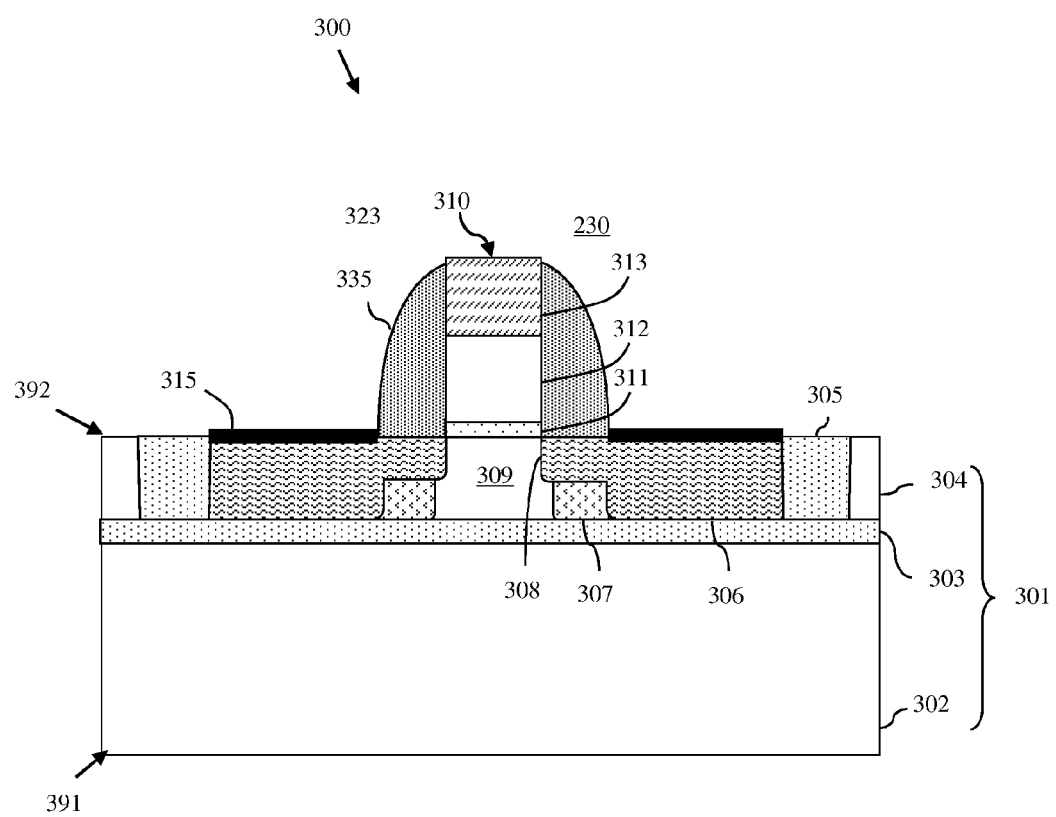
FIG. 5 is a partially completed semiconductor structure formed according to method embodiment of FIG. 2.

After the gate structure 310 is formed, additional conventional FET processing can be performed in order to complete the FET structure 300 (205) (see FIG. 5). This additional processing can include, but is not limited to, source/drain extension 308 formation, halo 307 formation, gate sidewall spacer 335 formation, source/drain region 306 formation and silicide 315 formation.

It should be noted that, if the gate conductor layer 312 and infrared absorbing layer 313 are not doped during a source/drain dopant implantation process, they may be in situ doped at process 205 or subsequently doped so that they have the appropriate conductivity type, depending upon whether an NFET or PFET is being formed. Those skilled in the art will recognize that for an NFET the source/drain regions 306, source/drain extensions 308, gate conductor layer 312 and infrared absorbing layer 313 within the gate structure 310 may be doped with an n-type dopant (e.g., a Group V dopant, such as arsenic (As), phosphorous (P) or antimony (Sb)) and the halos 307 and channel region 309 may be doped with a p-type dopant (e.g., a Group III dopant, such as boron (B) or indium (In)) Similarly, for a PFET the source/drain regions 306, source/drain extensions 308, gate conductor layer 312 and infrared absorbing layer 313 may be doped with a p-type dopant (e.g., a Group III dopant, such as boron (B) or indium (In)) and the halos 307 and channel region 309 may be doped with an n-type dopant (e.g., a Group V dopant, such as arsenic (As), phosphorous (P) or antimony (Sb)). Those skilled in the art will further recognize that the dopant concentration in these different regions may vary. For example, the concentration of dopant in the source/drain regions 306 is typically greater than that in the source/drain extensions 308, whereas the concentration of dopant in the halos 307 is typically greater than that in the channel region 309.

The discussion above regarding the doping of NFET and PFET components is offered for illustration purposes only and is not intended to be limiting. It should be understood that a field effect transistor formed at process 204 could be formed with any number of different configurations. For example, an NFET could be formed with a p-type gate and vice versa; an NFET or a PFET can be formed with a dual work function gate; an FFET or a PFET could be formed with a relatively low-dose halos; etc.

Figure 6:
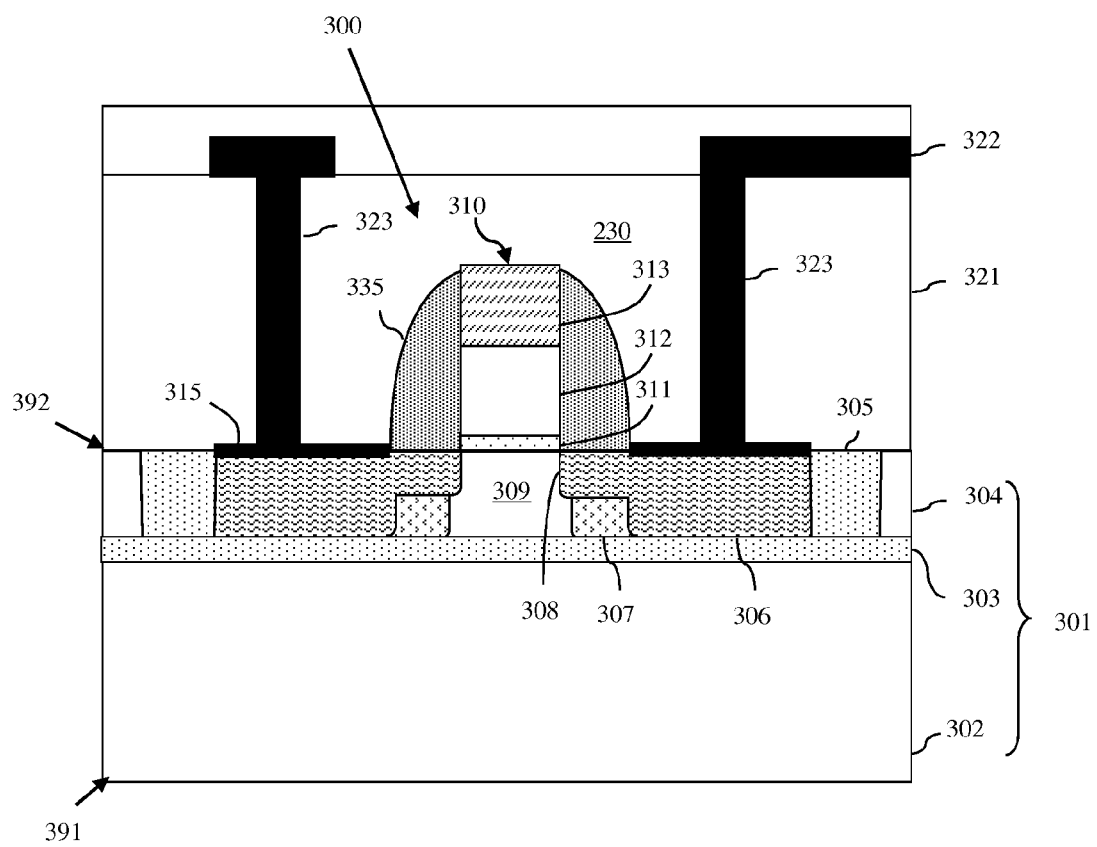
FIG. 6 is a partially completed semiconductor structure formed according to method embodiment of FIG. 2.

After the semiconductor device 300 is formed with the infrared absorbing layer 313, conventional BEOL processing can be performed to interconnect the semiconductor device 300 and other devices on the wafer 301 through contact and metal level formation (206) (see FIG. 6). That is, one or more dielectric layers 321 can be formed on the semiconductor device 300. The dielectric layer(s) 321 can comprise one or more conventional interlayer dielectric materials (e.g., a silicon nitride, a silicon oxide, borophosphosilicate glass (BPSG), etc.). Contacts 323 can be formed through the dielectric layer(s) 321, as necessary, and one or more levels of metal wiring 322 can be formed above the dielectric layer(s) 321 so as to interconnect the devices.

Figure 7:
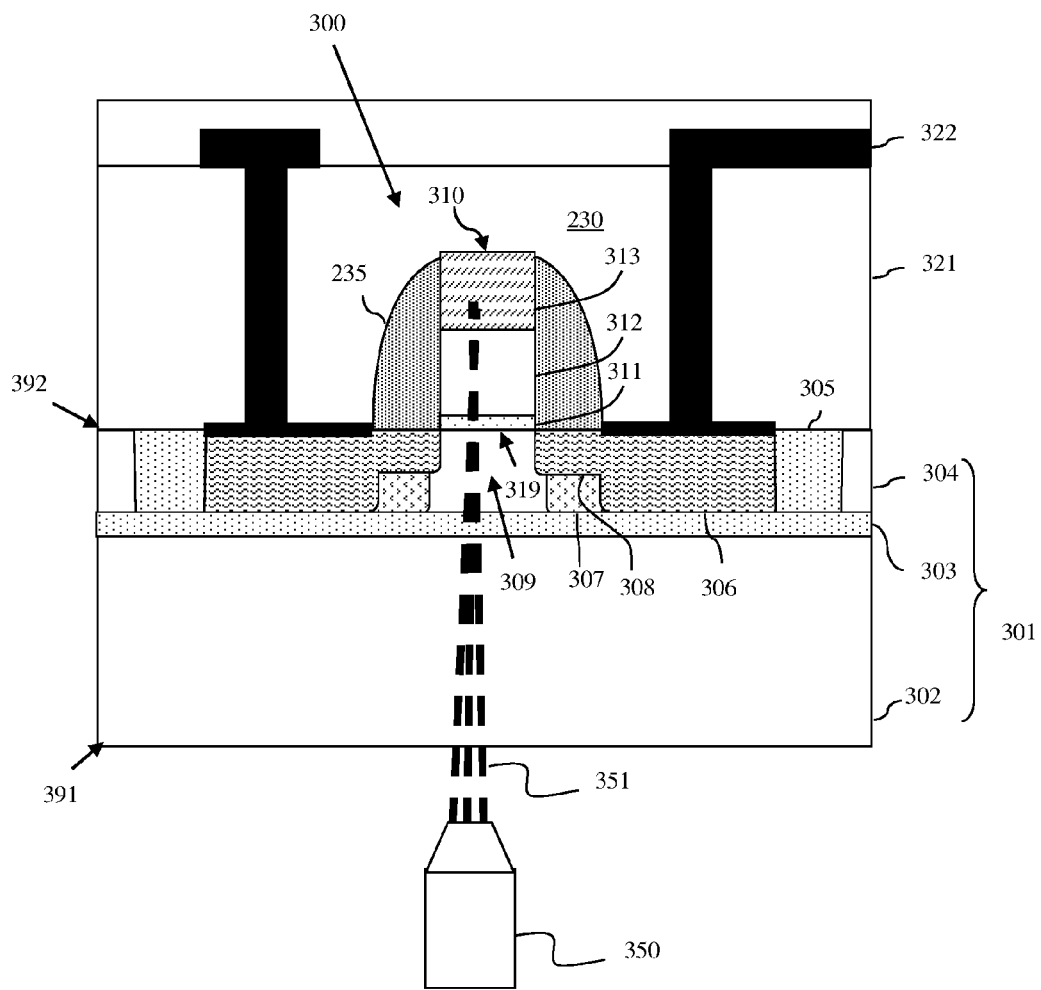
FIG. 7 is a completed semiconductor structure formed according to method embodiment of FIG. 2.

Following BEOL metal wiring layer formation at process 206, the infrared absorbing layer 313 can be selectively heated to a predetermined temperature (e.g., a temperature between approximately 200° C. and 800° C. or higher and, preferably, a temperature of approximately 450° C.) for a relatively short period of time (e.g., less than a second for higher temperatures and longer for lower temperatures) by exposing the bottom surface 391 of the wafer 301 to infrared radiation (i.e., to infrared light) (208) (see FIG. 7). The selective heating process 208 can be accomplished using either a continuous or pulsed infrared laser 350 capable of directing a beam 351 of infrared light to a localized region of the semiconductor device 300 and, particularly, to the infrared absorbing layer 313 within the gate structure 310 through the back surface 391 of the wafer 301. It should be noted that the specific infrared wavelength used in this selective heating process 208 will be preselected based on the infrared absorbing, transmitting and reflecting properties of both the infrared absorbing layer and the materials adjacent to the infrared absorbing layer. Those skilled in the art will recognize that temperature may also impact these properties.

For example, lights with wavelengths between about 0.7 μm and about 300 μm are within the infrared range. A bulk silicon wafer is opaque to lights with wavelengths between about 0.4 μm and about 1.1 μm; transparent to lights with wavelengths between about 1.2 μm and 8 μm, absorbs lights with wavelengths between about 8 μm and about 10 μm, transparent to lights with wavelengths between about 10 μm and 12 μm and absorbs light with wavelengths between about 15 μm and about 21 μm. A pure germanium layer is transparent to lights with wavelengths between about 2 μm and about 10 μm at room temperature, but absorbs lights with such wavelengths at temperatures greater than 100° C. Thus, if a bulk silicon wafer is provided at process 202 and if pure germanium infrared absorbing layer 313 is incorporated into the gate structure 310 at process 204, then an optimal illuminating infrared light used at process 208 can have a wavelength between about 1.2 μm and about 2 μm. These numbers will vary if either the wafer material or infrared absorbing material changes. In other words, the optimal wavelength will depend upon the relative transmittance of the infrared absorbing layer 313 and the material adjacent to the infrared absorbing layer 313.

This selective heating process 208 can be performed so that heat from the infrared absorbing layer 313 is transferred to the channel region 309 below the gate structure 310 and, optionally, to one or more additional regions of the device 300 adjacent to the channel region 309 (e.g., source/drain regions 306, halos 307, and/or source/drain extensions 308). However, the intensity and duration of this heating process 208 should be limited so as to avoid overheating the nearest BEOL metal structures 322 (e.g., so that the nearest BEOL metal structures are not heated above a predetermined temperature, such as 400 C.°). Specifically, the selective heating process 208 should be performed so that the rest of the wafer (i.e., all regions of the wafer other than the infrared absorbing layer and the adjacent regions 306-308 requiring heating) remains at a lower temperature (e.g., less than approximately 400° C.). It should be noted that if a higher heating temperature (e.g., a temperature over 800° C. and as high as 1100° C. for high dopant activation) is desired, the selective heating process 208 can be performed so as to achieve the higher heating temperature without overheating the nearest BEOL metal structures, e.g., by using a high speed laser capable of performing a sub-second heating process.

The transferred heat at process 208 can, for example, activate dopants in the channel region 309 and/or in the additional device region(s) 306-308 adjacent to the channel region 309 (221), change a state of (e.g., re-crystallize) the channel region 309 and/or the additional device region(s) 306-308 adjacent to the channel region 309 (222), repair damage caused by ion implantation into the channel region 309 and/or into the additional device region(s) 306-308 adjacent to the channel region 309 (223), diffuse dopants within or drive dopants out of the channel region 309 and/or the additional device region(s) 306-308 adjacent to the channel region 309 (224), etc. This selective heating process 208 can also be performed in a gas-containing atmosphere (e.g., a hydrogen-containing atmosphere) in order to passivate an interface 319 between the channel region 309 and the gate dielectric layer 311 by causing hydrogen atoms to terminate all electrically active dangling bonds at the interface (225).

For illustration purposes, the process steps of FIG. 2 are described above and illustrated in FIGS. 3-7 with respect to the formation of a planar field effect transistor 300. However, it should be understood that this method embodiment is not intended to be limited to planar field effect transistor formation, but rather the processes 202, 204, 206 and 208 could similarly be employed in the formation of any other type of field effect transistor (e.g., a fin-type, dual gate or trigate, field effect transistor).

Figure 8:
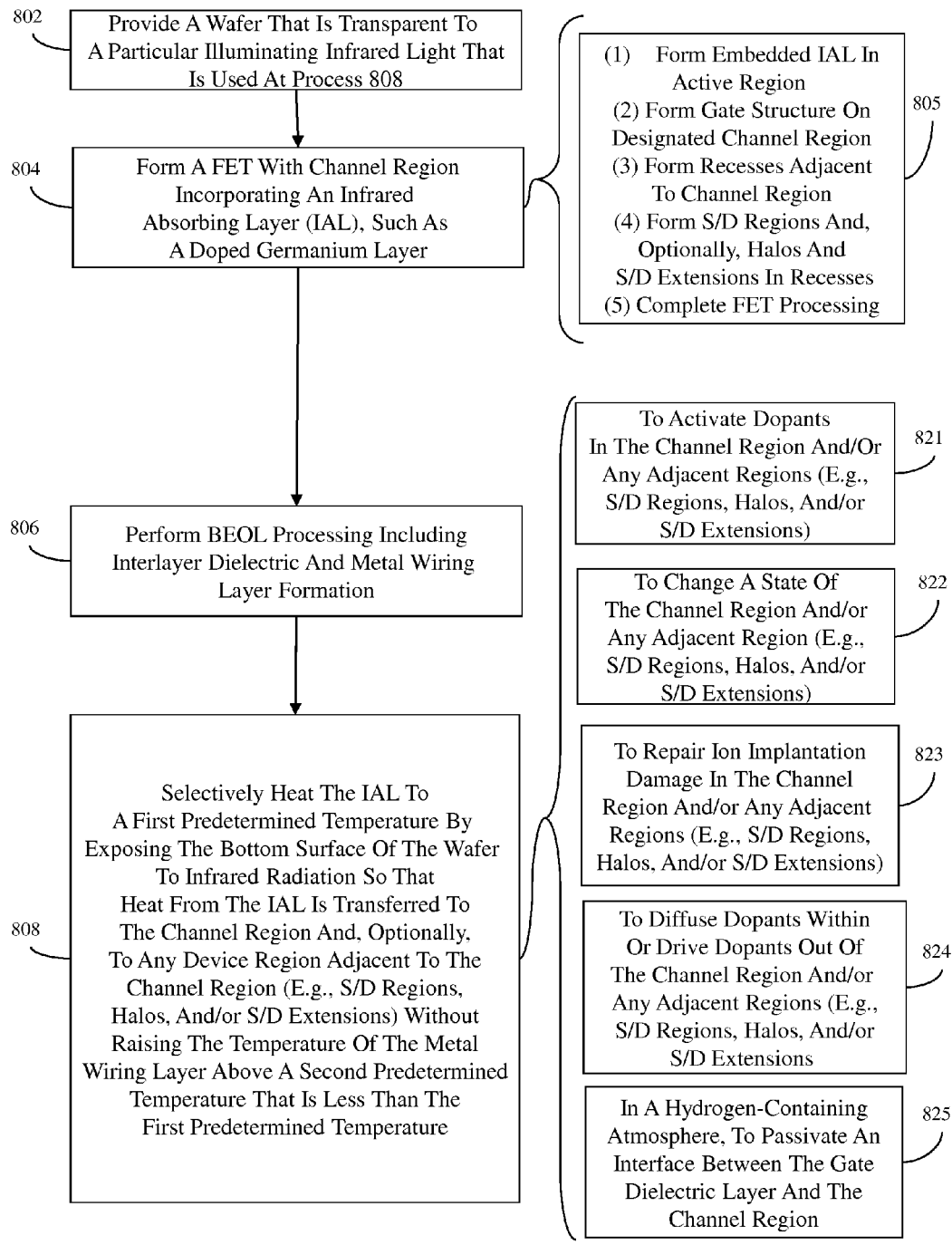
FIG. 8 is a flow diagram illustrating another exemplary embodiment of the method, according the present invention.
Figure 9:
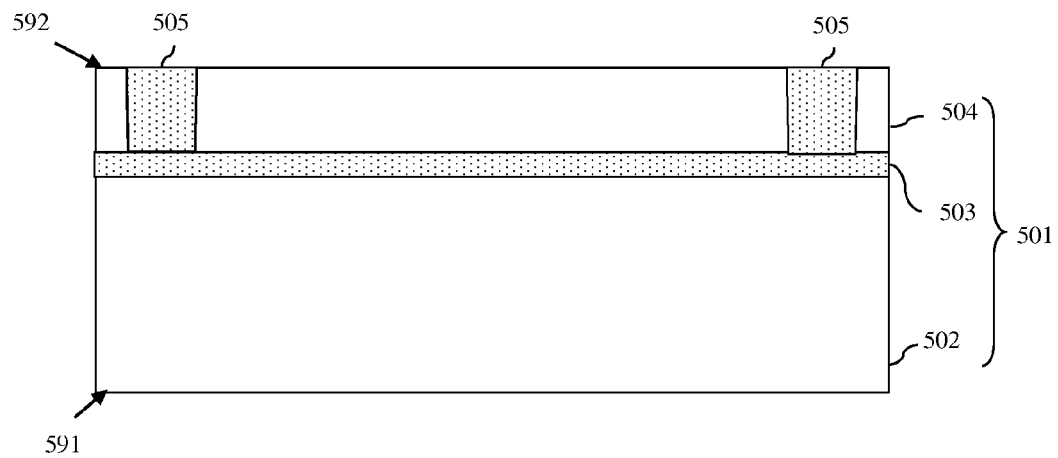
FIG. 9 is a partially completed semiconductor structure formed according to method embodiment of FIG. 8.

Referring to the flow diagram of FIG. 8, another exemplary embodiment of the method can comprise providing a semiconductor wafer 501 having a bottom surface 591 and a top surface 592 opposite the bottom surface 591 (802) (see FIG. 9). The provided wafer 501 can comprise, for example, a bulk silicon wafer. Alternatively, the wafer 501 can comprise, for example, a semiconductor-on-insulator (SOI) wafer, as shown in FIG. 9, comprising a silicon or glass substrate 502, a silicon oxide layer 503 on the substrate 501 and a single crystalline silicon layer 504 on the silicon oxide layer 503. However, in any case, the provided wafer 501 must be essentially transparent to the particular illuminating infrared light that will be used at process 808, discussed below.

Figure 10:
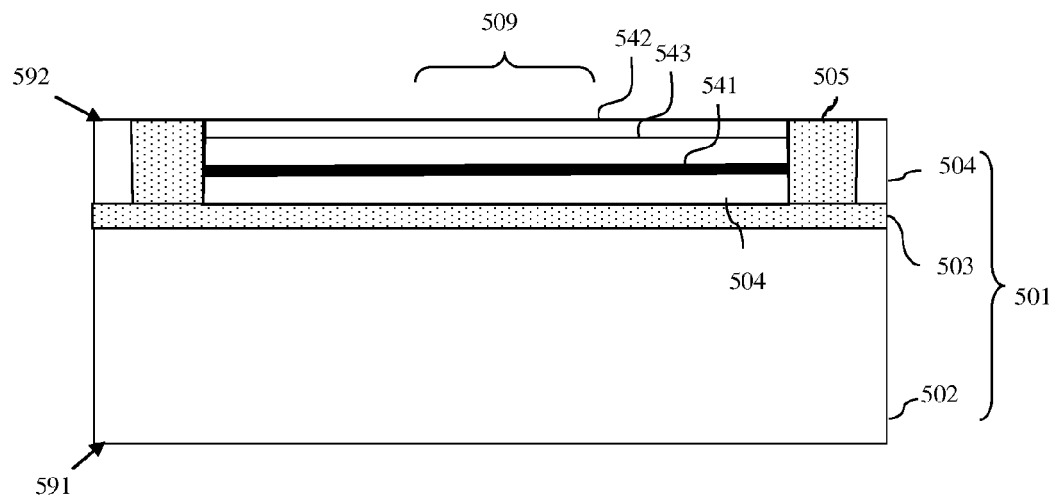
FIG. 10 is a partially completed semiconductor structure formed according to method embodiment of FIG. 8.

A semiconductor device and, particularly, a field effect transistor with a channel region incorporating an infrared absorbing layer can be formed adjacent to (e.g., within and/or on) the top surface 592 of the wafer (804). Specifically, isolation structures 505 (e.g., shallow trench isolation (STI) structures filled, for example, with silicon oxide) can be formed using conventional STI processing techniques to define the active region of the field effect transistor (see FIG. 9). Then, any one of various techniques can be used to form, within the active region, a channel region having an embedded infrared absorbing layer (805) (see FIG. 10).

For example, using a similar process flow to that disclosed in U.S. Patent Application Publication No. 20080248616 incorporated by reference above, the portion of the semiconductor layer 504 within the active region defined by the STIs 505 can be recessed. Then, epitaxial deposition processes can be used to form a monocrystalline silicon germanium seed layer 541 with a concentration of germanium between 20% and 90% on the recessed semiconductor layer 504, a strained monocrystalline germanium layer 543 on the seed layer 541, and another monocrystalline silicon germanium layer 542 with a very low concentration of germanium (e.g., a concentration of 10% or less) on the monocrystalline germanium layer 543.

Figure 11:
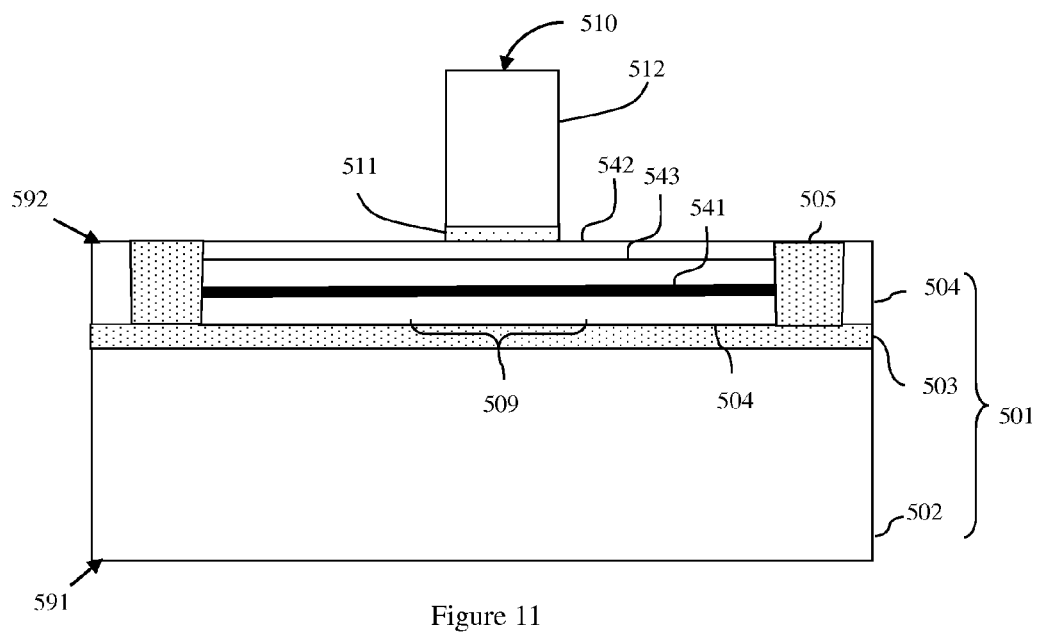
FIG. 11 is a partially completed semiconductor structure formed according to method embodiment of FIG. 8.

Next, a gate structure 510 can be formed on a designated channel region 509 within the active area defined by the STIs 505 (805) (see FIG. 11). The gate structure 510 can be formed using conventional deposition and lithographic processing techniques such that it comprises a gate dielectric layer 511 adjacent to the designated channel region 509 and a gate conductor layer 512 adjacent to the gate dielectric layer 511. In this gate structure 510, the gate dielectric layer 511 can comprise, for example, a silicon oxide layer, a silicon nitride layer, a high-k dielectric layer or other suitable gate dielectric material. The gate conductor layer 512 can comprise a polysilicon layer, a metal layer or any other suitable gate conductor material.

Figure 12:
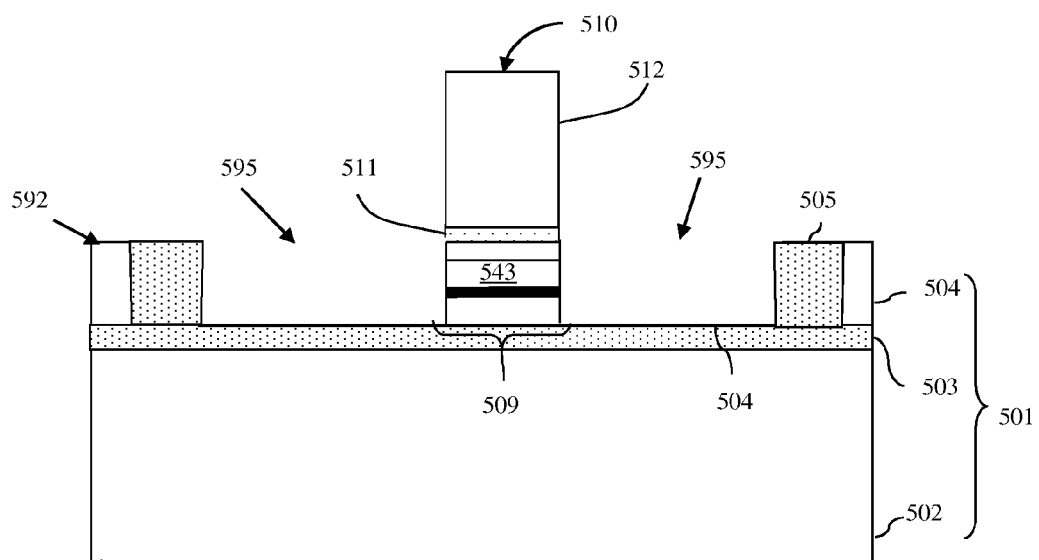
FIG. 12 is a partially completed semiconductor structure formed according to method embodiment of FIG. 8.
Figure 13:
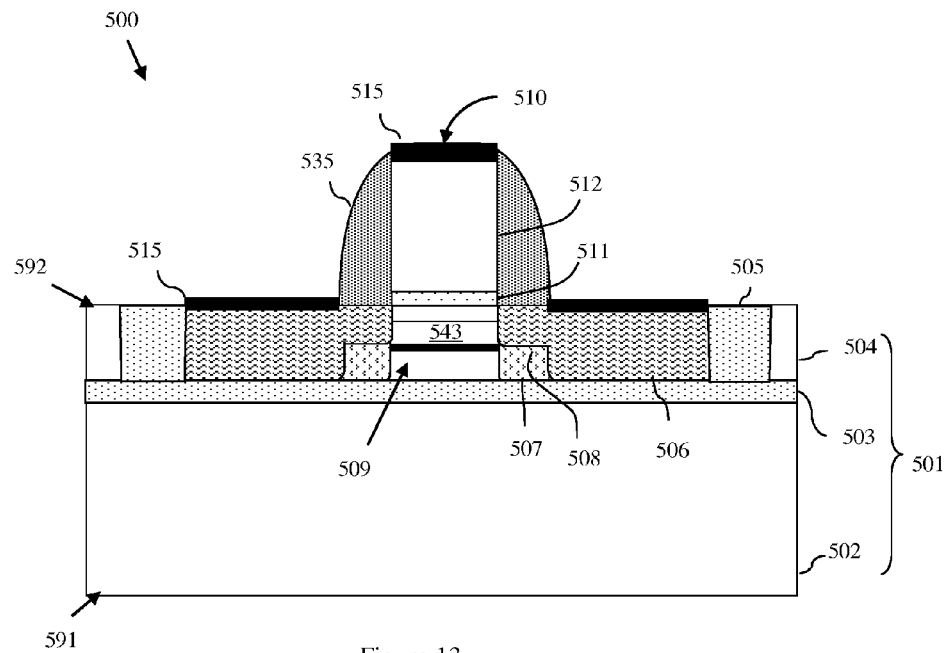
FIG. 13 is a partially completed semiconductor structure formed according to method embodiment of FIG. 8.

After the gate structure 510 is formed, a directional etch process can be used to form recesses 595 in the active region of the device between the channel region 509 and the STIs 505 (805) (see FIG. 12). After the recesses 595 are formed, additional conventional FET processing can be performed in order to complete the FET structure 500 (805) (see FIG. 13). These processes can include, but are not limited to, formation within the recesses 595 of source/drain extensions 508, halos 507 and source/drain regions 508 by epitaxial deposition with in-situ doping and/or subsequent doping, for example, by ion implantation. These processes can also include gate sidewall spacer 535 formation and silicide 515 formation.

It should be noted that, if a polysilicon gate conductor layer 512 is used and is not doped during a source/drain dopant implantation process, it may be in situ doped at process 805 or subsequently doped so that it has the appropriate conductivity type, depending upon whether an NFET or PFET is being formed. Those skilled in the art will recognize that for an NFET the source/drain regions 506, source/drain extensions 508 and polysilicon gate conductor layer 512 (if applicable) may be doped with an n-type dopant (e.g., a Group V dopant, such as arsenic (As), phosphorous (P) or antimony (Sb)) and the halos 507 and channel region 509, including the infrared absorbing layer 543, may be doped with a p-type dopant (e.g., a Group III dopant, such as boron (B) or indium (In)). However, for a PFET the source/drain regions 506, source/drain extensions 508 and polysilicon gate conductor layer 512 (if applicable) may be doped with a p-type dopant (e.g., a Group III dopant, such as boron (B) or indium (In)) and the halos 507 and channel region 509, including the infrared absorbing layer 543, may be doped with an n-type dopant (e.g., a Group V dopant, such as arsenic (As), phosphorous (P) or antimony (Sb)). Those skilled in the art will further recognize that the dopant concentration in these different regions may vary. For example, the concentration of dopant in the source/drain regions 506 is typically greater than that in the source/drain extensions 508, whereas the concentration of dopant in the halos 507 is typically greater than that in the channel region 509. The discussion above regarding the doping of NFET and PFET components is offered for illustration purposes only and is not intended to be limiting. It should be understood that a field effect transistor formed at process 804 could be formed with any number of different configurations. For example, an NFET could be formed with a p-type gate and vice versa; an NFET or a PFET can be formed with a dual work function gate; an FFET or a PFET could be formed with a relatively low-dose halos; etc.

Figure 14:
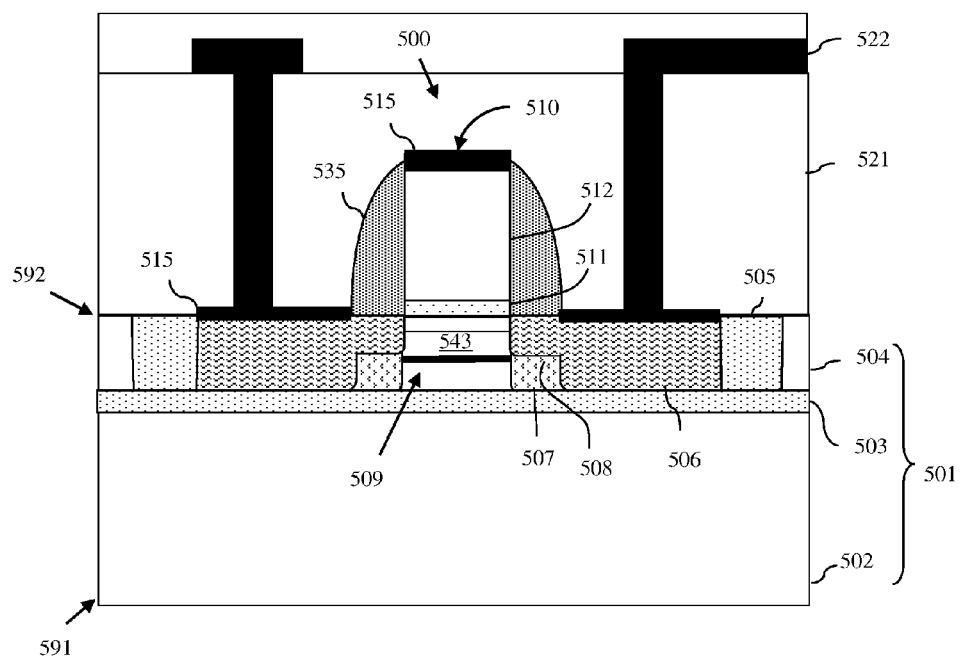
FIG. 14 is a partially completed semiconductor structure formed according to method embodiment of FIG. 8.

After the semiconductor device 500 is formed with the infrared absorbing layer 513, conventional BEOL processing can be performed to interconnect the semiconductor device 500 and other devices on the wafer 501 through contact and metal level formation (806) (see FIG. 14). That is, one or more dielectric layers 521 can be formed on the semiconductor device 500. The dielectric layer(s) 521 can comprise one or more conventional interlayer dielectric materials (e.g., a silicon nitride, a silicon oxide, borophosphosilicate glass (BPSG), etc. Contacts 523 can be formed through the dielectric layer(s) 521, as necessary, and one or more levels of metal wiring 522 can be formed above the dielectric layer(s) 521 so as to interconnect the devices.

Figure 15:
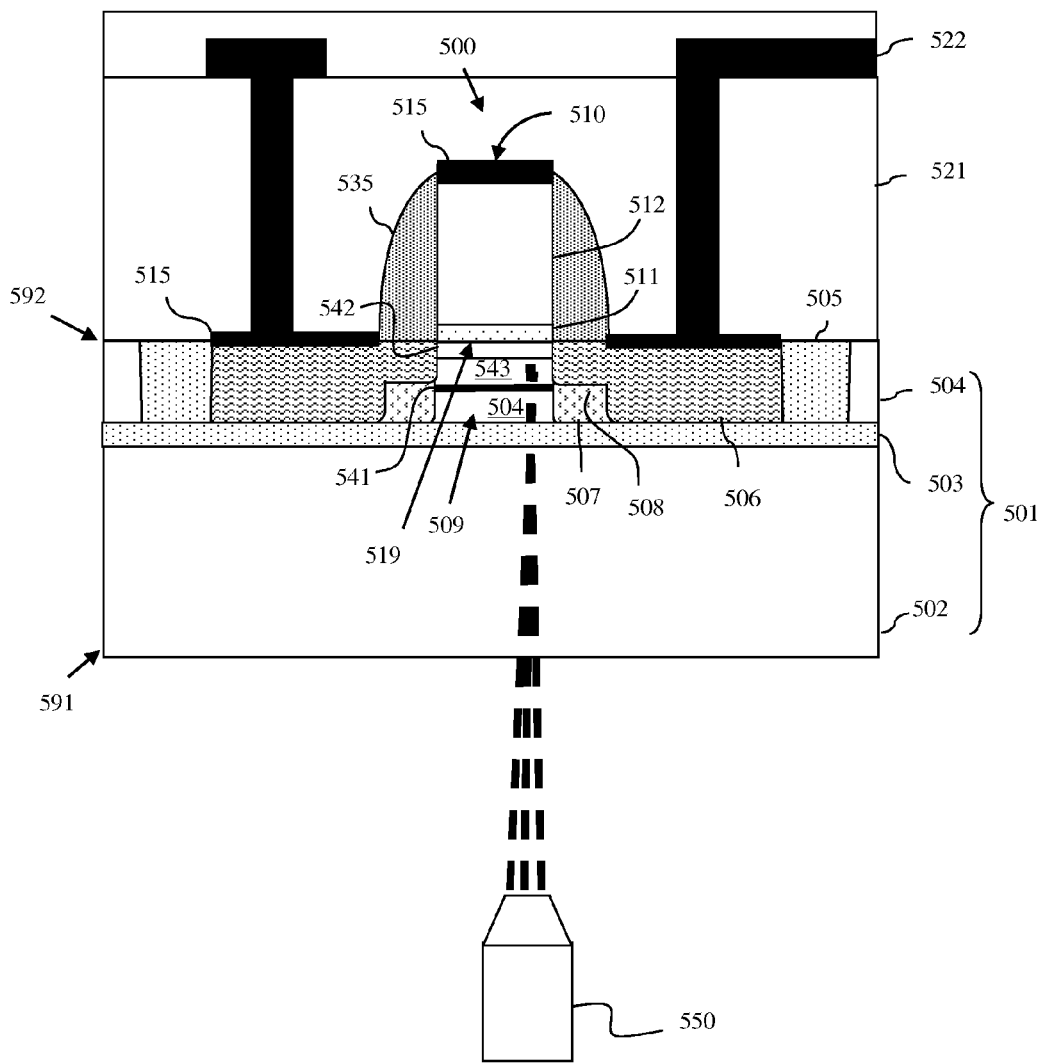
FIG. 15 is a completed semiconductor structure formed according to method embodiment of FIG. 8.

Following BEOL metal wiring layer formation at process 806, the infrared absorbing layer 543 can be selectively heated to a predetermined temperature (e.g., a temperature between approximately 200° C. and 800° C. or higher and, preferably, to a temperature of approximately 450° C.) for a relatively short period of time (e.g., less than a second for higher temperatures and longer for lower temperatures) by exposing the bottom surface 591 of the wafer 501 to infrared radiation (i.e., to infrared light) (808) (see FIG. 15). This selective heating process 808 can be accomplished using either a continuous or pulsed infrared laser 550 capable of directing a beam 551 of infrared light to a localized region of the semiconductor device 500 and, particularly, to the infrared absorbing layer 543 within the channel region 509 through the back surface 591 of the wafer 501. It should be noted that the specific infrared wavelength used in this selective heating process 808 will be preselected based on the infrared absorbing, transmitting and reflecting properties of both the infrared absorbing layer and the materials adjacent to the infrared absorbing layer. Those skilled in the art will recognize that temperature may also impact these properties.

For example, lights with wavelengths between about 0.7 μm and about 300 μm are within the infrared range. A bulk silicon wafer is opaque to lights with wavelengths between about 0.4 μm and about 1.1 μm; transparent to lights with wavelengths between about 1.2 μm and 8 μm, absorbs lights with wavelengths between about 8 μm and about 10 μm, transparent to lights with wavelengths between about 10 μm and 12 μm and absorbs light with wavelengths between about 15 μm and about 21 μm. A pure germanium layer is transparent to lights with wavelengths between about 2 μm and about 10 μm at room temperature, but absorbs lights with such wavelengths at temperatures greater than 100° C. Thus, if a bulk silicon wafer is provided at process 202 and if pure germanium infrared absorbing layer 313 is incorporated into the gate structure 310 at process 804, then an optimal illuminating infrared light used at process 808 can have a wavelength between about 1.2 μm and about 2 μm. These numbers will vary if either the wafer material or infrared absorbing material changes. In other words, the optimal wavelength will depend upon the relative transmittance of the infrared absorbing layer 543 and the material adjacent to the infrared absorbing layer 543.

The selective heating process 808 can be performed so that heat from the infrared absorbing layer 543 is transferred to the adjacent portions (e.g., see layers 504, 541 and 542) of the channel region 509 below the gate structure 510 and, optionally, to one or more additional regions of the device 500 adjacent to the channel region 509 (e.g., source/drain regions 506, halos 507 and/or source/drain extension 508). However, the intensity and duration of this heating process 808 should be limited so as to avoid overheating the nearest BEOL metal structures 522 (e.g., so that the nearest BEOL metal structures are not heated above a predetermined temperature, such as 400 C.°). Specifically, the selective heating process 808 should be performed so that the rest of the wafer (i.e., all regions of the wafer other than the infrared absorbing layer and the adjacent regions 504, 541-542, and 506-508) remains at a lower temperature (e.g., less than approximately 400° C.). It should be noted that if a higher heating temperature (e.g., a temperature over 800° C. and as high as 1100° C. for high dopant activation) is desired, the selective heating process 808 can be performed so as to achieve the higher heating temperature without overheating the nearest BEOL metal structures, e.g., by using a high speed laser capable of performing a sub-second heating process.

The transferred heat at process 808 can, for example, activate dopants in the channel region 509 and/or in the additional device region(s) 506-508 adjacent to the channel region 509 (821), change a state of (e.g., re-crystallize) the channel region 509 and/or the additional device region(s) 506-508 adjacent to the channel region 509 (822), repair damage caused by ion implantation into the channel region 509 and/or into the additional device region(s) 506-508 adjacent to the channel region 509 (823), diffuse dopants within or drive dopants out of the channel region 509 and/or the additional device region(s) 506-508 adjacent to the channel region 509 (824), etc. This selective heating process 808 can also be performed in a gas-containing atmosphere (e.g., a hydrogen-containing atmosphere) in order to passivate an interface 519 between the channel region 509 and the gate dielectric layer 511 by causing hydrogen atoms to terminate all electrically active dangling bonds at the interface (825).

For illustration purposes, the process steps of FIG. 8 are described above and illustrated in the FIGS. 9-15 with respect to the formation of a planar field effect transistor 500. However, it should be understood that this method embodiment is not intended to be limited to planar field effect transistor formation, but rather the processes 802, 804, 806 and 808 could similarly be employed in the formation of any other type of field effect transistor (e.g., a fin-type, dual gate or trigate, field effect transistor).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments of a semiconductor wafer processing method that allow device regions to be selectively annealed following back end of the line (BEOL) metal wiring layer formation without degrading wiring layer reliability. In the embodiments, a semiconductor device is formed adjacent to the top surface of a wafer such that it incorporates a selectively placed infrared absorbing layer. Then, following BEOL metal wiring layer formation, the bottom surface of the wafer is exposed to an infrared light having a wavelength that is transparent to the wafer. The infrared light is absorbed by and, thereby heats up the infrared absorbing layer to a first predetermined temperature (e.g., a dopant activation temperature, a temperature required for a state change, etc.). The resulting heat is transferred from the infrared absorbing layer to an adjacent region of the semiconductor device without raising the temperature of the metal wiring above a second predetermined temperature (e.g., a temperature that could degrade the metal wiring, such as the melting temperature of the wiring material) that is lower than the first predetermined temperature. Such selectively placed infrared absorbing layers can be used to selectively anneal various different device regions of various different types of devices following back end of the line (BEOL) metal wiring layer formation without degrading wiring layer reliability.

What is claimed is:

1. A method comprising:
providing a wafer having a bottom surface and a top surface opposite said bottom surface;
forming a semiconductor device adjacent to said top surface such that said semiconductor device incorporates an infrared absorbing layer, said infrared absorbing layer being selectively placed within said semiconductor device;
forming at least one dielectric layer on said semiconductor device;
forming a contact extending vertically through said at least one dielectric layer to said semiconductor device;
forming, above said at least one dielectric layer and immediately adjacent to said contact, at least one layer of metal for a back end of the line (BEOL) metal wiring level; and
after said forming of said at least one layer of metal, selectively heating said infrared absorbing layer to a first predetermined temperature by exposing said bottom surface of said wafer to infrared radiation,
said infrared absorbing layer being selectively placed within said semiconductor device and said selectively heating of said infrared absorbing layer being performed so that heat from said infrared absorbing layer is transferred to a region of said semiconductor device adjacent to said infrared absorbing layer without raising the temperature of said at least one layer of metal to above a second predetermined temperature that is lower than said first predetermined temperature.

2. The method of claim 1, said exposing comprising illuminating said bottom surface with an infrared light having a particular wavelength, said wafer being transparent to said infrared light having said particular wavelength and said infrared absorbing layer being capable of absorbing said infrared light having said particular wavelength.

3. The method of claim 1, said selectively heating being performed in a gas containing atmosphere to passivate an interface between different materials within said region of said semiconductor device.

4. The method of claim 1, said selectively heating being performed to activate dopants in said region of said semiconductor device.

5. The method of claim 1, said selectively heating being performed to change a state of said region of said semiconductor device.

6. The method of claim 1, said selectively heating being performed to repair damage caused by ion implantation into said region of said semiconductor device.

7. The method of claim 1, said infrared absorbing layer comprising a germanium layer.

8. The method of claim 1, said semiconductor device comprising a field effect transistor and said infrared absorbing layer being incorporated into at least one of a gate structure of said field effect transistor, a channel region of said field effect transistor and a source/drain region of said field effect transistor.

9. A method comprising:
providing a wafer having a bottom surface and a top surface opposite said bottom surface;
forming a semiconductor device adjacent to said top surface, said forming of said semiconductor device comprising forming a gate structure on a channel region such that said gate structure incorporates an infrared absorbing layer, said infrared absorbing layer being selectively placed within said gate structure and said forming of said gate structure comprising: forming a gate dielectric layer adjacent to said channel region, a gate conductor layer adjacent to said gate dielectric layer and said infrared absorbing layer positioned one of between said gate dielectric layer and said gate conductor layer and above said gate conductor layer;
forming at least one dielectric layer on said semiconductor device;
forming at least one contact extending vertically through said at least one dielectric layer to said semiconductor device;
forming, above said at least one dielectric layer and immediately adjacent to said contact, at least one layer of metal for a back end of the line (BEOL) metal wiring level; and
after said forming of said at least one layer of metal, selectively heating said infrared absorbing layer to a first predetermined temperature by exposing said bottom surface of said wafer to infrared radiation,
said infrared absorbing layer being selectively placed within said gate structure and said selectively heating of said infrared absorbing layer being performed so that heat from said infrared absorbing layer is transferred to said channel region below said gate structure without raising the temperature of said at least one layer of metal to above a second predetermined temperature that is lower than said first predetermined temperature.

10. The method of claim 9, said exposing comprising illuminating said bottom surface with an infrared light having a particular wavelength, said wafer being transparent to said infrared light having said particular wavelength and said infrared absorbing layer being capable of absorbing said infrared light having said particular wavelength.

11. The method of claim 9, said selectively heating being performed in a hydrogen containing atmosphere to passivate an interface between said channel region and said gate dielectric layer.

12. The method of claim 9, said heat further being transferred to an additional region of said semiconductor device adjacent to said channel region and said selectively heating being performed to activate dopants in at least one of said channel region and said additional region.

13. The method of claim 9, said heat further being transferred to an additional region of said semiconductor device adjacent to said channel region and said selectively heating being performed to change a state of at least one of said channel region and said additional region.

14. The method of claim 9, said heat further being transferred to an additional region of said semiconductor device adjacent to said channel region and said selectively heating being performed to repair damage caused by ion implantation into at least one of said channel region and said additional region.

15. The method of claim 9, said infrared absorbing layer comprising a doped germanium layer.

16. A method comprising:
providing a wafer having a bottom surface and a top surface opposite said bottom surface;
forming a semiconductor device adjacent to said top surface such that said semiconductor device comprises a channel region and an infrared absorbing layer, said infrared absorbing layer being selectively placed within said channel region;
forming at least one dielectric layer on said semiconductor device;
forming at least contact extending vertically through said at least one dielectric layer to said semiconductor device;
forming, above said at least one dielectric layer and immediately adjacent to said contact, at least one layer of metal for a back end of the line (BEOL) metal wiring level; and
after said forming of said at least one layer of metal, selectively heating said infrared absorbing layer to a first predetermined temperature by exposing said bottom surface of said wafer to infrared radiation,
said infrared absorbing layer being selectively placed within said channel region and said selectively heating of said infrared absorbing layer being performed so that heat from said infrared absorbing layer is transferred to portions of the channel region adjacent to said infrared absorbing layer without raising the temperature of said at least one layer of metal to above a second predetermined temperature that is lower than said first predetermined temperature.

17. The method of claim 16, said exposing comprising illuminating said bottom surface with an infrared light having a particular wavelength, said wafer being transparent to said infrared light having said particular wavelength and said infrared absorbing layer being capable of absorbing said infrared light having said particular wavelength.

18. The method of claim 16, said selectively heating being performed in a hydrogen containing atmosphere to passivate an interface between said channel region and a gate dielectric layer.

19. The method of claim 16, said heat further being transferred to an additional region of said semiconductor device adjacent to said channel region and said selectively heating being performed to at least one of activate dopants in at least one of said channel region and said additional region, change a state of at least one of said channel region and said additional region and repair damage caused by ion implantation into at least one of said channel region and said additional region.

20. The method of claim 16, said infrared absorbing layer comprising a strained germanium layer.

\* \* \* \* \*